United States Patent
Ha

(10) Patent No.: US 8,620,000 B2
(45) Date of Patent: Dec. 31, 2013

(54) APPARATUS AND METHOD FOR CONTROLLING AUDIO OUTPUT, AND MOBILE TERMINAL SYSTEM USING THE SAME

(75) Inventor: Seung Hwan Ha, Seoul (KR)

(73) Assignee: Pantech Co., Ltd., Seoul (KR)

( * ) Notice: Subject to any disclaimer, the term of this patent is extended or adjusted under 35 U.S.C. 154(b) by 783 days.

(21) Appl. No.: 12/537,653

(22) Filed: Aug. 7, 2009

(65) Prior Publication Data

US 2010/0054499 A1    Mar. 4, 2010

(30) Foreign Application Priority Data

Aug. 26, 2008 (KR) .......... 10-2008-0083330

(51) Int. Cl.
*H04R 29/00* (2006.01)
*H03G 3/00* (2006.01)

(52) U.S. Cl.
USPC ............. 381/56; 381/58; 381/104; 381/107; 455/572; 455/138

(58) Field of Classification Search
USPC ............ 381/56–58, 104–109, 74, 312, 381/320–321; 700/94; 455/219, 572–574, 455/343.1–343.6, 127.1–127.5, 136–138; 704/210
See application file for complete search history.

(56) References Cited

U.S. PATENT DOCUMENTS

| | | | | |
|---|---|---|---|---|
| 5,365,570 A | * | 11/1994 | Boubelik | 455/565 |
| 5,471,527 A | * | 11/1995 | Ho et al. | 379/347 |
| 7,062,302 B2 | * | 6/2006 | Yamaoka | 455/574 |
| 7,248,710 B2 | * | 7/2007 | Roeck | 381/312 |
| 7,627,353 B2 | * | 12/2009 | Glissman et al. | 455/574 |
| 2009/0226009 A1 | * | 9/2009 | Huyts et al. | 381/107 |

* cited by examiner

*Primary Examiner* — Xu Mei
(74) *Attorney, Agent, or Firm* — H.C. Park & Associates, PLC

(57) ABSTRACT

An audio output controlling apparatus and method, and a mobile terminal system using the same control settings of an audio out port according to whether an audio frame includes an audio signal. The audio output controlling method includes receiving an audio frame, determining whether an audio signal is included in the audio frame, and setting, depending on whether the audio signal is included in the audio frame, a power voltage provided to an audio out port. The mobile terminal includes a wireless transceiver; an audio unit, through an audio out port, an audio frame among the wireless data; and an audio output controlling unit to control a power voltage of the audio out port. The apparatus includes a section determining unit; and a power controlling unit to set a power voltage provided to an audio out port according to whether the audio signal is included in the audio frame.

17 Claims, 5 Drawing Sheets

APPARATUS AND METHOD FOR CONTROLLING AUDIO OUTPUT, AND MOBILE TERMINAL SYSTEM USING THE SAME

CROSS-REFERENCE TO RELATED APPLICATION

This application claims priority from and the benefit of Korean Patent Application No. 10-2008-0083330, filed on Aug. 26, 2008, which is hereby incorporated by reference for all purposes as if fully set forth herein.

BACKGROUND OF THE INVENTION

1. Field of the Invention

Exemplary embodiments of the present invention relate to an apparatus and method for controlling audio output, and a mobile terminal system using the same, and more particularly, to an apparatus and method for controlling audio output, and a mobile terminal system that may control a gain and a power voltage of an audio out port.

2. Discussion of the Background

In general, a mobile terminal, such as a cellular phone, a personal digital assistant (PDA), and the like, may include a variety of additional service functions, such as a digital camera, a video communication, providing a TV broadcast program, playing multimedia data, accessing the Internet, and the like, in addition to wireless communication.

The mobile terminal capable of video communication is able to display an image in addition to providing voice communication, and thus, power consumption increases while the mobile terminal displays the image and an internal controlling device excessively performs operations. Accordingly, the battery may be more quickly drained.

Also, the mobile terminal provides a predetermined power voltage to an audio out port regardless of whether an audio frame includes an audio signal, thereby needlessly increasing battery consumption. When the audio frame excludes the audio signal, the mobile terminal could provide a lower power voltage compared with a power voltage of when the audio frame include the audio signal. However, the mobile terminal regularly provides the predetermined power voltage regardless of whether the audio frame includes the audio signal. Therefore, a higher power voltage is unnecessarily provided, causing increased battery consumption.

Also, the mobile terminal sets a gain for the audio out port to be high, thereby increasing the output power.

There is a need for an apparatus and method for controlling audio output, and a mobile terminal system for controlling gain and power voltage of the audio out port, thereby reducing unnecessary battery consumption.

SUMMARY OF THE INVENTION

Exemplary embodiments of the present invention provide an audio output controlling an apparatus and method for controlling audio output, and a mobile terminal system, using the same that may control a gain and a power voltage of an audio out port according to an audio frame section.

Additional features of the invention will be set forth in the description which follows, and in part will be apparent from the description, or may be learned by practice of the invention.

An exemplary embodiment of the present invention discloses a method for controlling an audio output by receiving an audio frame; determining whether an audio signal is included in the audio frame; and setting a power voltage provided to an audio out port according to whether the audio signal is included in the audio frame.

An exemplary embodiment of the present invention also discloses a mobile terminal having a wireless transceiver to transceive wireless data; an audio unit to output, through an audio out port, an audio frame among the wireless data; and an audio output controlling unit to control a power voltage of the audio out port according to whether an audio signal is included in the audio frame.

An exemplary embodiment of the present invention also discloses an apparatus to control an audio output having a section determining unit to receive an audio frame and to determine whether an audio signal is included in an audio frame; and a power controlling unit to set a power voltage provided to an audio out port according to whether the audio signal is included in the audio frame.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
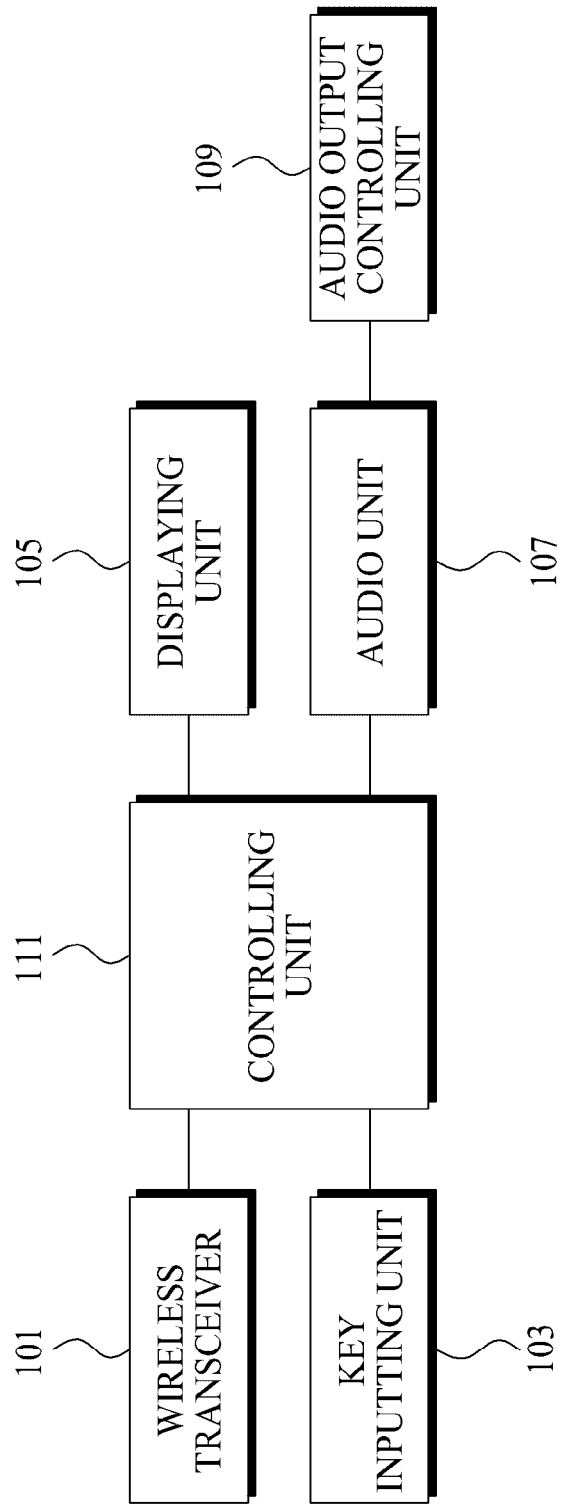
FIG. 1 is a block diagram illustrating a configuration of a mobile terminal including an audio output controlling apparatus according to an exemplary embodiment of the present invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

FIG. 1 is a block diagram illustrating a configuration of a mobile terminal including an audio output controlling apparatus according to an exemplary embodiment of the present invention.

Referring to FIG. 1, the mobile terminal, including the audio output controlling apparatus, may include a wireless transceiver 101, a key inputting unit 103, a displaying unit 105, an audio unit 107, an audio output controlling unit 109, and a controlling unit 111.

The wireless transceiver 101 may transceive wireless data and image data for video communication.

The key inputting unit 103 may include number keys, function keys, and/or letter and/or alphanumeric keys, and the like to input a user command for displaying data or for transmitting/receiving wireless data.

The displaying unit 105 may display data such as a video image, an image, and the like. In this instance, the data may be transmitted/received wireless data or internally stored data.

The audio unit 107 may output audio data received through the wireless transceiver 101 through an audio out port (not illustrated). In this instance, the audio unit 107 converts digital audio data into analog voice and outputs the converted analog voice through the audio out port, and converts an analog voice inputted through an audio input port (not illustrated) into digital audio data and transmits the converted digital audio data through the wireless transceiver 101.

The audio output controlling unit 109 may control a power voltage of the audio out port depending on whether an audio signal is included in the audio frame. Also, the audio output controlling unit 109 may control a gain of the audio out port depending on whether the audio signal is included in the audio frame.

That is, the audio output controlling unit 109 sets the power voltage of the audio out port or the gain of the audio out port differently depending on whether the audio signal is included in the audio frame, thereby controlling the power voltage or the gain of the audio out port. As an example, the audio output controlling unit 109 sets the power voltage to a minimum voltage when the audio signal is excluded from the audio frame, and sets the power voltage to a normal voltage when the audio signal is included in the audio frame.

For example, the audio output controlling unit 109 may compare an audio signal level of the audio frame with a predetermined level and then determine whether the audio signal is included in the audio frame. That is, the audio output controlling unit 109 determines that the audio signal is included in the audio frame if the audio signal level of the audio frame exceeds the predetermined level. Conversely, the audio output controlling unit 109 determines that the audio signal is excluded from the audio frame if the audio signal level of the audio frame is less than or equal to the predetermined level. In other words, the audio signal level may dictate or control whether the audio signal is included in the audio frame.

The audio output controlling unit 109 may connect to the audio out port, such as a speaker, a headset, and the like.

The controlling unit 111 may generally control operations for voice communication, video communication, and transmission/reception of a message.

The mobile terminal controls the voltage and the gain of the audio out port using the audio output controlling unit 109, depending on whether the audio signal is included in the audio frame. Particularly, if the audio signal is excluded from the audio frame, the mobile terminal provides a minimum voltage and applies a low gain, thereby reducing power consumption. Also, white noise decreases, which may improve quality of communication.

Figure 2:
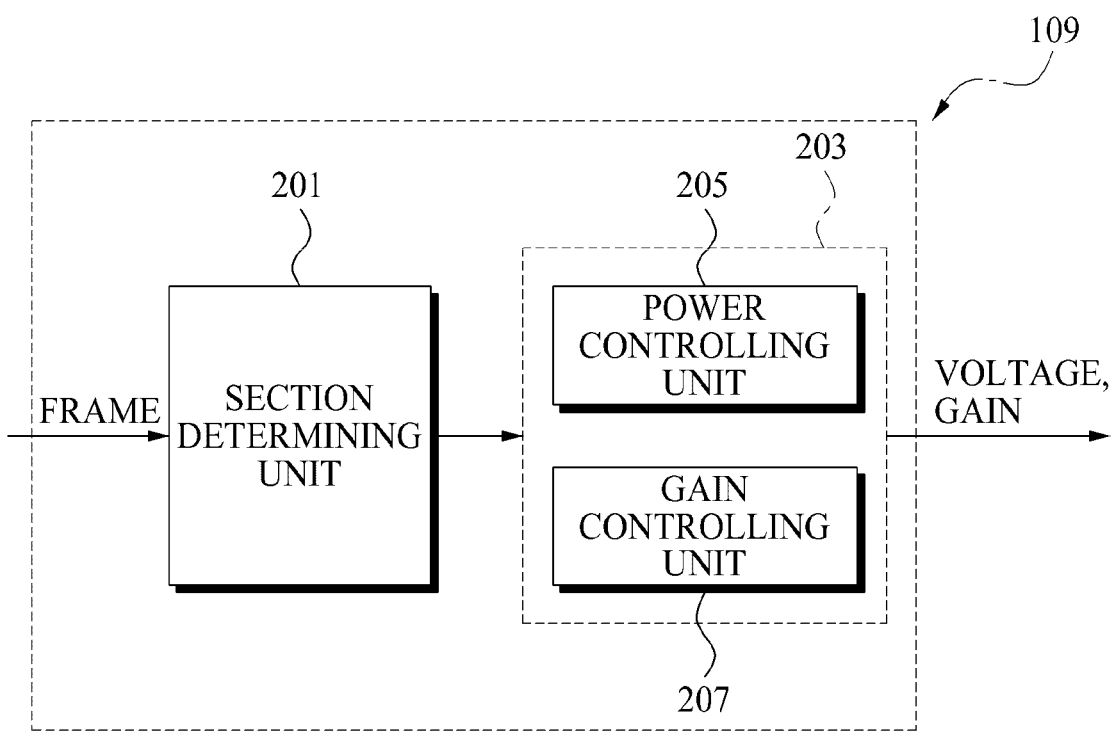
FIG. 2 is a block diagram illustrating a configuration of an audio output controlling apparatus according to an exemplary embodiment of the present invention.

FIG. 2 is a block diagram illustrating a configuration of an audio output controlling apparatus according to an exemplary embodiment of the present invention.

Referring to FIG. 2, the audio output controlling apparatus 109 may include a section determining unit 201 and an audio out port controlling unit 203.

The section determining unit 201 may receive an audio frame through an audio unit to determine whether the received audio frame is a Good Frame or a No Frame depending on whether the received audio frame includes an audio signal, or depending on whether the received audio frame includes an audio signal that exceeds a threshold. For example, the section determining unit 201 may determine that the audio signal is included in the audio frame if the audio signal level of the audio frame exceeds a predetermined level. Conversely, the audio output controlling unit 109 may determine that the audio signal is excluded from the audio frame if the audio signal level of the audio frame is less than or equal to the predetermined level. Also, the section determining unit 201 determines whether the audio frame is a sound section or a silent section depending on whether each of the received audio frame and a prior audio frame received prior to the received audio frame is the Good Frame or the No Frame.

Particularly, if the received audio frame is the No Frame excluding the audio signal and the prior audio frame received prior to the received frame is the Good Frame including the audio signal, the section determining unit 201 determines the received audio frame as a first silent section. If the received audio frame is the No Frame and the prior audio frame is the No Frame, the section determining unit 201 determines the received audio frame as a second silent section. Also, if the received audio frame is the Good Frame, the section determining unit 201 determines the received audio frame as a sound section regardless of a type of the prior audio frame received prior to the received frame.

In this instance, although an exemplary embodiment describes that the section determining unit 201 recognizes the Good Frame or the No Frame based on existence of the audio signal, the embodiment is not limited thereto and an audio codec may also recognize the Good Frame or the No Frame. The audio out port controlling unit 203 may include a power controlling unit 205 and a gain controlling unit 207.

The power controlling unit 205 may set a power voltage based on a determination result of the section determining unit 201, and may provide the set power voltage to an audio out port.

Particularly, the power controlling unit 205 may set the power voltage to a minimum voltage if the audio signal is excluded from the audio frame. Conversely, the power controlling unit 205 may set the power voltage to a normal voltage if the audio signal is included in the audio frame. In this instance, the minimum voltage may be 3.0 V and the normal voltage may be 3.8 V. Thus, the audio signal level may dictate or control the power controlling unit 205, through the section determining unit 201, to provide a voltage of 3.0 V or 3.8 V to the audio out port.

Figure 3:
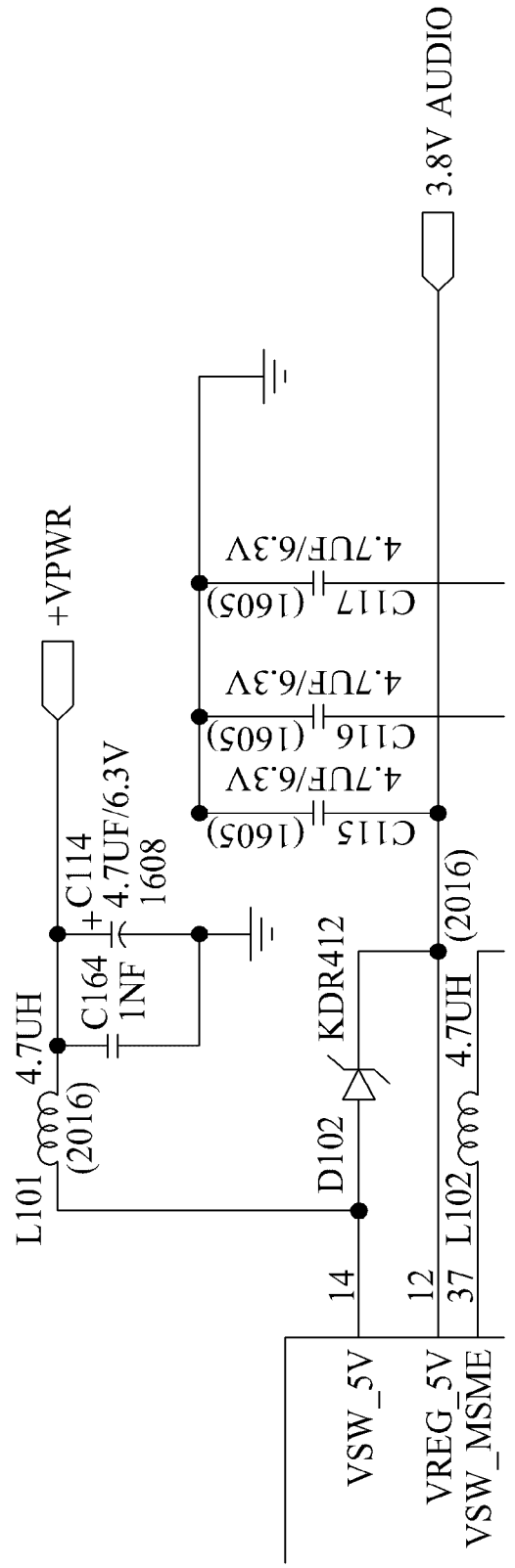
FIG. 3 is a circuit diagram illustrating a power voltage driving circuit included in a power controlling unit of FIG. 2.
Figure 4:
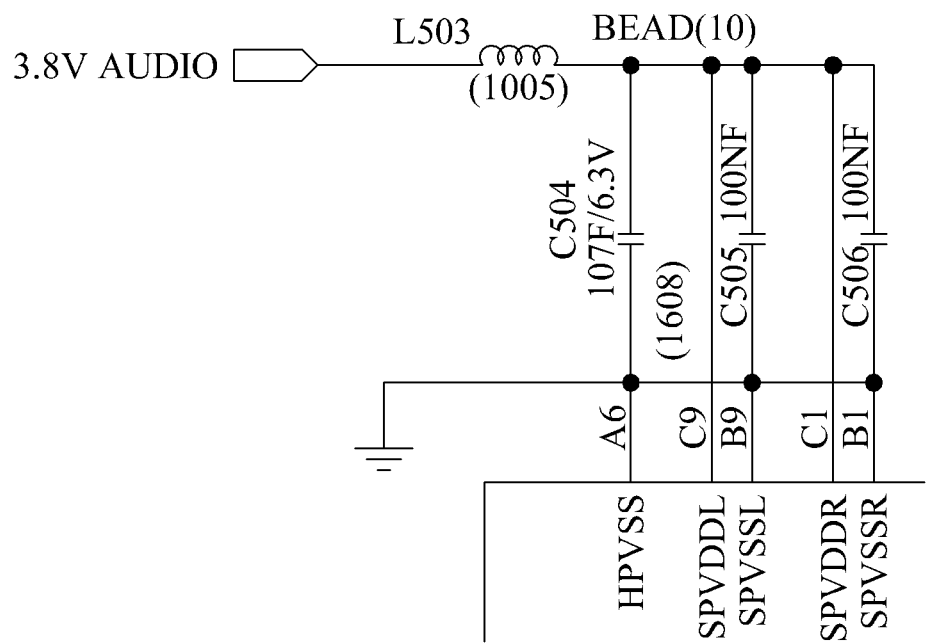
FIG. 4 is a diagram illustrating a power supply unit of an audio out port where a power voltage is inputted.

A power voltage driving circuit included in the power controlling unit 205 may be equivalent to FIG. 3. The outputted power voltage of FIG. 3 may be inputted as a power input of an audio out port of FIG. 4. Accordingly, the power controlling unit 205 controls the power voltage driving circuit to control the power voltage of the audio out port.

The gain controlling unit 207 sets the gain of the audio out port based on the determination result of the section determining unit 201. The gain controlling unit 207 may set the gain of the audio out port differently for each of the first silent section, the second or subsequent silent section, and the sound section.

As an example, if the audio frame is determined as the first silent section by the section determining unit 201 and the first silent section is maintained for a predetermined time, that is, for 360 ms, the gain controlling unit 207 may change the gain of the audio out port from 0 dB to −5 dB at a reception volume of 10. If the audio frame is determined as the second silent section by the section determining unit 201 and the second silent section is maintained for a predetermined time, that is, for 360 ms, the gain controlling unit 207 may change the gain of the audio out port from −5 dB to −10 dB at the reception volume of 10. Also, if the audio frame is determined as the sound section by the section determining unit 201 and the sound section is maintained for a predetermined time, that is, for 60 ms, the gain controlling unit 207 may set the gain of the audio out port to 0 dB at the reception volume of 10. In this instance, if the sound section is maintained for a predetermined time after the first silent section, the gain is changed again from −5 dB to 0 dB, and if the sound section is maintained for a predetermined time after the second silent section, the gain is changed again from −10 dB to 0 dB.

The audio output controlling apparatus according to exemplary embodiments sets and provides the gain and the voltage of the audio out port differently for each section status of the audio frame, thereby controlling the gain and the voltage of the audio out port. Accordingly, the audio output controlling apparatus has an effect of increasing efficiency of an electric current and also may reduce white noise.

Figure 5:
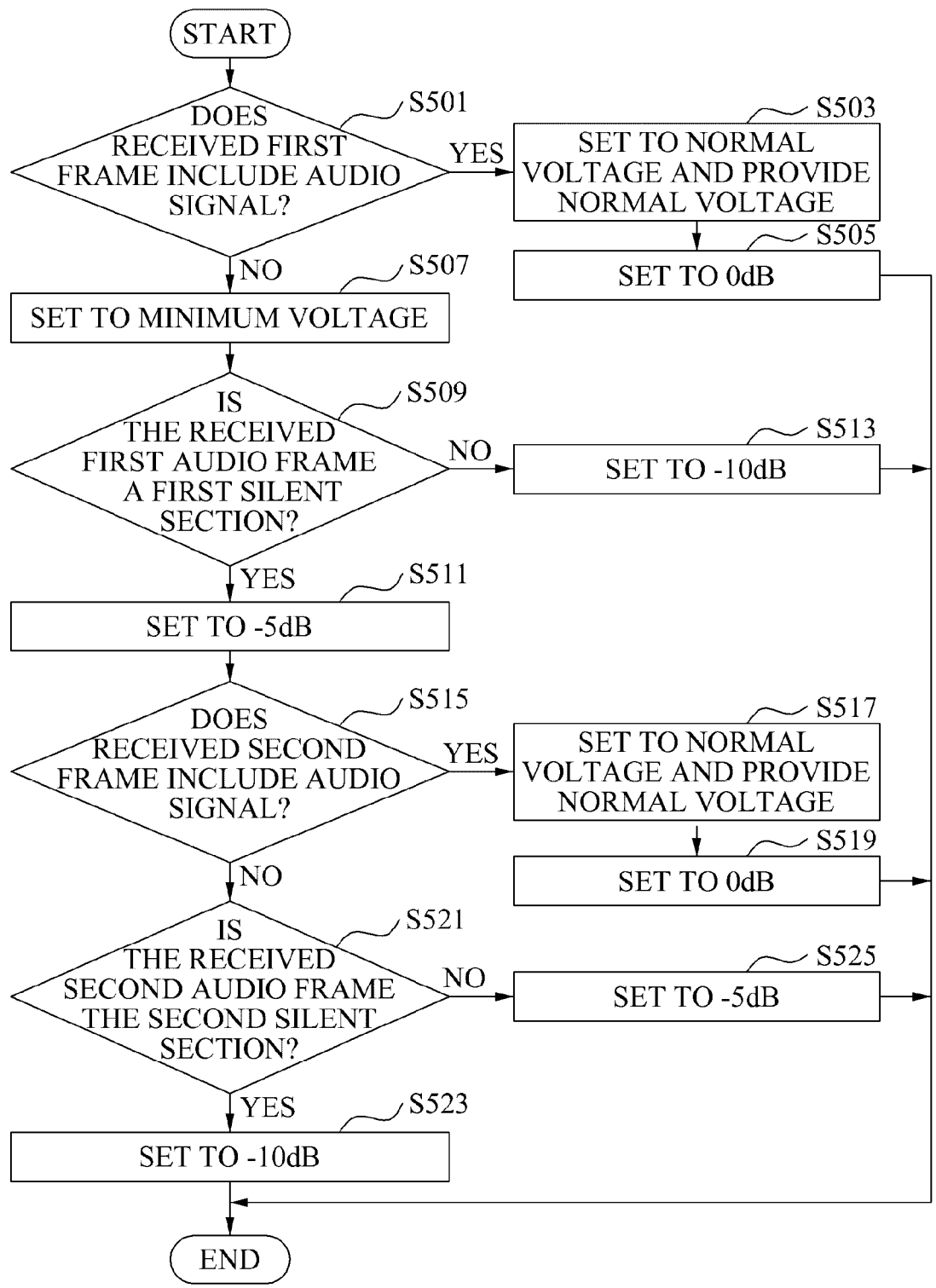
FIG. 5 is a flowchart illustrating an audio output controlling method according to an exemplary embodiment of the present invention.

FIG. 5 is a flowchart illustrating an audio output controlling method according to an exemplary embodiment of the present invention.

Referring to FIG. 5, the audio output controlling apparatus determines whether a received first audio frame includes an audio signal in operation S501.

Here, the audio output controlling apparatus compares an audio signal level of the first audio frame with a predetermined level and determines whether the first audio signal is included in the audio frame. That is, the audio output controlling apparatus determines that the audio signal is included in the first audio frame if the audio signal level of the first audio frame exceeds the predetermined level. Conversely, the audio output controlling unit 109 determines that the audio signal is excluded from the first audio frame if the audio signal level of the first audio frame is less than or equal to the predetermined level.

Also, the audio output controlling apparatus determines whether the received first audio frame is a Good Frame or a No Frame depending on whether the received first audio frame includes an audio signal. That is, the audio output controlling apparatus determines the first audio frame as a Good Frame if the first audio frame includes the audio signal, and determines the first audio frame as a No Frame if the first audio frame excludes the audio signal.

Next, the audio output control apparatus controls at least one of a power voltage of an audio out port or a gain of the audio out port based on a determination result on whether the first audio frame is the Good Frame or the No Frame.

Particularly, if the first audio frame is the Good Frame, the audio output controlling apparatus may determine the first audio frame as the sound section regardless of whether a zero$^{th}$ audio frame includes an audio signal, the zero$^{th}$ audio frame being received prior to the first audio frame. The audio output controlling apparatus also may set the power voltage to a normal voltage, and may provide the set normal voltage to an audio out port in operation S503. Also, the audio output controlling apparatus may set the gain of the audio out port to 0 dB at the reception volume of 10 in operation S505.

Conversely, if the received first audio frame is the No Frame, the audio output controlling apparatus may set the power voltage to a minimum voltage and may provide the set voltage to the audio out port in operation S507.

Next, the audio output controlling apparatus determines whether the received first audio frame is a first silent section in operation S509. Particularly, if the received first audio frame is the No Frame and the zero$^{th}$ audio frame received prior to the received first audio frame is the Good Frame, the audio output controlling apparatus may determine the received first audio frame as the first silent section. Also, if the received first audio frame is the No Frame and the zero$^{th}$ audio frame received prior to the received first audio frame is the No Frame, the audio output controlling apparatus may determine the received first audio frame as a second silent section. That is, the audio output controlling apparatus may determine the received first audio frame as the first silent section if the received first audio frame is the No Frame and the zero$^{th}$ audio frame received prior to the received first audio frame is the Good Frame, and may also determine the received first audio frame as the second silent section if the received first audio frame is the No Frame and the zero$^{th}$ audio frame received prior to the received first audio frame is the No Frame.

Next, as a result of the determination in operation S509, if the received first audio frame is the first silent section and the first silent section is maintained for a predetermined time, the audio output controlling apparatus may set the gain of the audio out port to −5 dB at the reception volume of 10 in operation S511.

Conversely, as a result of the determination in operation S509, if the received first audio frame is the second silent section as opposed to being the first silent section and the second silent section is maintained for a predetermined time, the audio output controlling apparatus may set the gain of the audio out port to −10 dB at the reception volume of 10 in operation S513.

Next, the audio output controlling apparatus determines whether a second audio frame includes an audio signal in operation S515.

That is, the audio output controlling apparatus determines the second audio frame as a Good Frame if the second audio frame includes the audio signal, and determines the second audio frame as a No Frame if the second audio frame excludes the audio signal.

Particularly, if the second audio frame is the Good Frame, the audio output controlling apparatus may determine the second audio frame as the sound section, may set the power voltage to the normal voltage, and may provide the set normal voltage to the audio out port in operation S517. Also, the audio output controlling apparatus may set the gain of the audio out port to 0 dB at the reception volume of 10 in operation S519.

Conversely, if the received second audio frame is the No Frame, the audio output controlling apparatus determines whether the received second audio frame is the second silent section in operation S521.

Particularly, if the received second audio frame is the No Frame and the first audio frame received prior to the received second audio frame is the No Frame, the audio output controlling apparatus determines the received second audio frame as the second silent section. Also, if the received second frame is the No Frame and the first audio frame received prior to the second frame is the Good Frame, the audio output controlling apparatus determines the received second audio frame as the first silent section.

Next, as a result of the determination in operation S521, if the received second audio frame is the second silent section and the second silent section is maintained for a predetermined time, the audio output controlling apparatus may set the gain of the audio out port to −10 dB at a reception volume of 10 in operation S523.

Conversely, as the result of the determination in operation S521, if the received second audio frame is the first silent section as opposed to being the second silent section and the first silent section is maintained for a predetermined time, the audio output controlling apparatus may set the gain of the audio out port to −5 dB at the reception volume of 10 in operation S525.

Here, the audio output controlling apparatus may provide the minimum voltage set in the first silent section to the audio out port.

The audio output controlling method according to exemplary embodiments of the present invention may control the voltage and the gain of the audio out port, and thereby may increase efficiency of an electric current and may reduce white noise.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for controlling an audio output, the method comprising:
    receiving a first audio frame;
    determining whether an audio signal is included in the first audio frame;
    setting a power voltage provided to an audio out port according to whether the audio signal is included in the first audio frame;
    setting a gain of the audio out port according to whether the audio signal is included in the first audio frame;
    receiving a second audio frame adjacent to the first audio frame;
    determining whether the audio signal is included in the second audio frame;
    setting the gain of the audio out port to a first gain if the audio signal is included in the second audio frame; and
    setting the gain of the audio out port to a second gain if the audio signal is excluded from the second audio frame and the audio signal is excluded from the first audio frame.

2. The method of claim 1,
    wherein the power voltage is a first non-zero voltage if the audio signal is excluded from the first audio frame, and the power voltage is a second non-zero voltage if the audio signal is included in the first audio frame.

3. The method of claim 1, wherein the audio signal is determined to be excluded from the first audio frame if an audio signal level of the first audio frame is less than or equal to a predetermined level.

4. The method of claim 1, wherein the power voltage is 3.0 V if the audio signal is excluded from the first audio frame.

5. The method of claim 1, wherein the power voltage is set to a minimum voltage if the audio signal is excluded from the first audio frame, and
    the power voltage is set to a normal voltage if the audio signal is included in the first audio frame.

6. The method of claim 1, wherein the power voltage is 3.0 V or 3.8 V.

7. The method of claim 1, further comprising setting the gain of the audio out port to a third gain if the audio signal is excluded from the second audio frame and the audio signal is included in the first audio frame.

8. A method for controlling an audio output, the method comprising:
    receiving an audio frame;
    determining whether an audio signal is included in the audio frame;
    setting a power voltage provided to an audio out port according to whether the audio signal is included in the audio frame;
    setting a gain of the audio out port according to whether the audio signal is included in the audio frame;
    determining the audio frame as a first silent section if the audio frame is a No Frame, the No Frame excluding an audio signal, and a prior audio frame received prior to the audio frame is a Good Frame, the Good Frame including an audio signal;
    determining the audio frame as a second silent section if the audio frame is a No Frame and the prior audio frame received prior to the audio frame is a No Frame; and
    determining the audio frame as a sound section if the audio frame is a Good Frame,
    wherein the audio out port is set differently for each of the first silent section, the second silent section, and the sound section.

9. A mobile terminal, comprising:
    a wireless transceiver to transceive wireless data;
    an audio unit to output, through an audio out port, an audio frame among the wireless data; and
    an audio output controlling unit to control a power voltage of the audio out port according to whether an audio signal is included in the audio frame, and to control a gain of the audio out port according to whether the audio signal is included in the audio frame.

10. The system of claim 9, wherein the audio output controlling unit determines that the audio signal is excluded from the audio frame if an audio signal level of the audio frame is less than or equal to a predetermined level.

11. The method of claim 9, wherein the power voltage is 3.0 V if the audio signal is excluded from the audio frame, and the power voltage is 3.8 V if the audio signal is included in the audio frame.

12. The mobile terminal of claim 9, wherein the audio output controlling unit comprises a power controlling unit to set the power voltage to a first non-zero power voltage if the audio signal is included in the audio frame, and to set the power voltage to a second non-zero power voltage lower than the first non-zero power voltage if the audio signal is excluded from the audio frame.

13. An apparatus to control an audio output, comprising:
    a section determining unit to receive an audio frame and to determine whether an audio signal is included in an audio frame, the audio frame comprising a first audio frame and a second audio frame adjacent to the first audio frame; and
    a power controlling unit to set a power voltage provided to an audio out port according to whether the audio signal is included in the audio frame; and
    a gain controlling unit to control a gain of the audio out port according to whether the audio signal is included in the first audio frame and the second audio frame,
    wherein the gain controlling unit sets the gain of the audio out port to a first gain if the audio signal is included in the second audio frame, and sets the gain of the audio out port to a second gain if the audio signal is excluded from the second audio frame and the audio signal is excluded from the first audio frame.

14. The apparatus of claim 13, wherein the section determining unit determines that the audio signal is excluded from the audio frame if an audio signal level of the audio frame is less than or equal to a predetermined level.

15. The apparatus of claim 13, wherein the power controlling unit sets the power voltage to a first non-zero voltage if the audio signal is excluded from the audio frame, and sets the power voltage to a second non-zero voltage if the audio signal is included in the audio frame.

16. The apparatus of claim 13, wherein the power voltage is 3.0 V if the audio signal is excluded from the audio frame, and the power voltage is 3.8 V if the audio signal is included in the audio frame.

17. The apparatus of claim 13, wherein the gain controlling unit sets the gain of the audio out port to a third gain if the audio signal is excluded from the second audio frame and the audio signal is included in the first audio frame.

* * * * *